United States Patent [19]
Kobatake

[11] Patent Number: 5,459,349
[45] Date of Patent: Oct. 17, 1995

[54] SEMICONDUCTOR DEVICE WITH REDUCED NOISE PROPAGATION BETWEEN CIRCUIT BLOCKS

[75] Inventor: Hiroyuki Kobatake, Tokyo, Japan

[73] Assignee: NEC Corporation, Tokyo, Japan

[21] Appl. No.: 237,394

[22] Filed: May 3, 1994

[30] Foreign Application Priority Data

May 13, 1993 [JP] Japan .................................. 5-111906

[51] Int. Cl.$^6$ .................. H01L 23/552; H01L 29/76; H01L 29/94
[52] U.S. Cl. .................. 257/659; 257/369; 257/371
[58] Field of Search .................. 257/369, 371, 257/659

[56] References Cited

FOREIGN PATENT DOCUMENTS 62-12147  1/1987  Japan .................................. 257/659
1-112765  5/1989  Japan .................................. 257/659

Primary Examiner—Steven H. Loke
Attorney, Agent, or Firm—Young & Thompson

[57] ABSTRACT

A twin-well semiconductor device comprises a P-substrate having an inherent region including a separating zone and two pairs of an N-well and a P-well in the vicinity of the main surface of the P-substrate. An analog and a digital circuit block are formed on each one of the pairs of the N-well and the P-well. In the P-well of the analog circuit, a P+ diffused layer is formed between the boundary of the P-well and the analog circuit block, and is maintained at a ground potential. The P-type separating region is provided therein with an N-well in which an N+ diffused layer connected to Vdd line is formed. Due to the high equivalent resistance of the undoped separating zone of the semiconductor substrate separating the circuit blocks and the small junction capacitances formed between the separating zone and the N-well, noise propagating from the digital circuit block to the analog circuit block can be reduced.

7 Claims, 5 Drawing Sheets

SEMICONDUCTOR DEVICE WITH REDUCED NOISE PROPAGATION BETWEEN CIRCUIT BLOCKS

BACKGROUND OF THE INVENTION (a) Field of the Invention

The present invention relates to a semiconductor device, and more particularly, to a semiconductor device in which propagation of noise between two circuit blocks can be reduced.

(b) Description of Related Art

Semiconductor device comprising so-called "twin-wells" have been developed for realizing microminiaturization of semiconductor devices such as MOS-FETs. In such twin-well semiconductor devices, the semiconductor substrate is made of a semiconductor material of a first conductive type, and a first well of the first conductive type and a second well of a second conductive type opposite to the first conductive type are formed in pair in the vicinity of a main surface of the semiconductor substrate. Transistors are formed on and within the pair of wells to form desired circuits. Twin-well semiconductor devices are used, for example, for hybrid circuits including an analog circuit and a digital circuit in combination. In such hybrid circuits, it is important to reduce noise propagating from the digital circuit to the analog circuit.

FIG. 1A is a schematic plan view of a conventional twin-well semiconductor device for an analog/digital hybrid circuit, and FIG. 1B is a sectional view taken along dashed line B–B' of FIG. 1A. In the vicinity of a main surface of a P-type semiconductor substrate (P-substrate) 30 having a first impurity concentration, a P-well 33 and two N-wells 32 each having an impurity concentration higher than the first impurity concentration are formed on an undoped region 31 of the P-substrate 30. Each of N-wells 32 is located adjacent to the P-well 33 in twin well fashion. Further, there are formed circuit blocks CB31 and CB32 each having a circuit area spreading over both one of the N-wells 32 and the P-well 33. For example, circuit block CB31 is an analog circuit block, while circuit block CB32 is a digital circuit block which constitutes a noise source against the analog circuit block CB31.

A P+ diffused layer 34 is formed in the P-well 33 to shield circuit block CB31 against circuit block CB32, and is electrically connected to a ground line 36 through contact holes 35 formed in an insulator layer 37. With this arrangement, the electric potential at a portion of the P-well 33 located at the periphery of circuit block CB31 is stabilized so that the amount of noise propagating from circuit block CB32 to circuit block CB31 is reduced.

In the conventional semiconductor device shown in FIGS. 1A and 1B, the undoped region 31 of the P-substrate 30 having a first impurity concentration, including an impurity at NA=1E15 cm-3 ($10^{15}$ atoms/cm$^3$) for example, and the P-well 33 having a second impurity concentration, including an impurity at NA=1E17 cm-3 for example, are both disposed between circuit block CB32 and circuit block CB31. Therefore, as illustrated in FIG. 1B, circuit block CB32 and circuit block CB31 are coupled with each other through an equivalent resistance R31 of the P-well 33 formed in the vicinity of the main surface of the P-substrate 31 and an equivalent resistance R32 of the undoped region 31 of the P-substrate 30 located below the P-well 33.

For example, the resistivity $r_{PSUB}$ of the undoped region 31 of the P-substrate 30 is about 12 Ω–cm whereas the resistivity $r_{PWEL}$ of the P-well 33 is about 0.3 Ω–cm. Accordingly, it can be said that the P-well 33 has a considerably low resistivity (i.e., about 1/40) as compared to the undoped region 31 of the P-substrate 30. Since the equivalent resistances R31 and R32 are proportional to the resistivities of the P-well 33 and the undoped region 31 of the P-substrate 30, respectively, the relationship between the equivalent resistances R31 and R32 becomes R31<<R32, taking account of their spreading resistances, even though the depth of the P-well 33 is smaller than the depth of the undoped region 31.

Since the ground line 36 and the P+ diffused layer 34 are not ideal conductors and have some impedances, noise propagating through the P-well 33 having a small resistance, i.e., through the equivalent resistance R31, cannot be sufficiently reduced, even while noise propagating through the P-substrate 31, i.e., through the equivalent resistance R32, can be sufficiently reduced.

FIG. 2A shows a schematic plan view of another twin-well semiconductor device for an analog/digital hybrid circuit disclosed in Japanese Patent Laid-Open Publication No. 1(1989)-112765. FIG. 2B is a sectional view taken along dashed line B–B' of FIG. 2A. In the vicinity of a main surface of a P-substrate 30 having a first impurity concentration, P-wells 33 and N-wells 32 each having an impurity concentration higher than the first impurity concentration are formed on an undoped region of the P-substrate 30 in a twin well fashion. Further, there are formed circuit blocks CB31 and CB32 each having a circuit area spreading over both one of the N-wells 32 and the P-well 33.

A cross-talk reducing N-well 32' having a predetermined width is formed between the P-wells 33 to surround the periphery of circuit block CB31, and the N-well 32' is electrically connected to a Vdd source line (high potential source line) 38 through contact holes 35 formed in an insulator layer 37. With this arrangement, since the semiconductor device shown in FIGS. 2A and 2B is provided with the cross-talk reducing N-well 32' which is formed between circuit block CB32 and circuit block CB31 and which is connected to the Vdd source line 38, the DC component of noise flowing through the surface of the P-substrate 30 including the P-well 33 can be reduced.

With the semiconductor device shown in FIGS. 2A and 2B, circuit block CB32 and circuit block CB31 are electrically coupled with each other through a parallel circuit, which is composed of a serial impedance including the equivalent resistances R33 and R35 of the P-wells 33, the equivalent resistance R34 of the cross-talk reducing N-well 32' and the junction capacitances C31 and C32 formed between the P-wells 33 and the N-well 32', and the equivalent resistance R32 of the undoped region 31 of the P-substrate 30 located below the wells 33 and 32'. The resistivity $r_{NWEL}$ of the cross-talk reducing N-well 32' (including an impurity at ND=1E17 cm–3, for example) is very low, i.e., about 0.1 Ω–cm, so that the equivalent resistance R34 of the N-well 32' is very low, comparable to the equivalent resistances R33 and R35 of the P-wells 33. The junction capacitance per unit area C between the P-wells 33 and the N-well 32' is expressed by the following formulas:

$$C = \sqrt{\{(q \cdot X_{Si} \cdot e_o \cdot NA \cdot ND)/(2(NA+ND) \cdot (\phi+|VR|))\}} \quad (1\text{-a})$$

$$\phi = (kT/q) \cdot \ln\{(NA \cdot ND)/n_i^2\} \quad (1\text{-b})$$

wherein q is the charge of an electron, $X_{Si}$ is the relative permittivity of silicon, $e_o$ is the permittivity in a vacuum, k is Boltzmann's constant, and $n_i$ is the concentration of electrons in an intrinsic silicon semiconductor.

Assuming that the bias voltage VR is −5 V, the junction capacitance per unit area C becomes $C=2.6E-08$ F/cm$^2$, which is considerably large value. Therefore, the junction capacitances between the P-wells 33 and the N-well 32' are considerably large, and the impedance of the serial circuit including R33, R34, R35, C31 and C32 therefore becomes low, especially in a high-frequency range.

Noise generated by circuit block CB32 forming a digital circuit block includes many high-frequency components as well as a DC component. Since circuit block CB32 and circuit block CB31 shown in FIGS. 2A and 2B are coupled through the serial circuit including R33, R34, R35, C31 and C32 and having an impedance especially low in a high-frequency range, as described above, the reduction of noise by the serial circuit is not sufficient for the high-frequency components of the noise.

Accordingly, in both the conventional twin-well semiconductor devices as described above, noise propagating between circuit blocks cannot be sufficiently reduced. This means that an analog signal generated in an analog/digital circuit includes a considerably large noise, resulting in an insufficient accuracy of the analog signal due to a low S/N ratio in the analog signal.

SUMMARY OF THE INVENTION

In view of the foregoing problems involved in the conventional semiconductor devices, it is an object of the present invention to provide an improved semiconductor device which can sufficiently reduce noise propagating between two circuit blocks having different functions, thereby increasing accuracy of signals and reliability of the semiconductor devices.

The present invention provides a semiconductor device comprising a semiconductor substrate of a first conductive type defining an undoped region of the semiconductor substrate having a first impurity concentration and at least two pairs of wells including a first well of the first conductive type and a second well of a second conductive type disposed adjacent to each other in pair in the vicinity of a main surface of the semiconductor substrate. Each of the wells has an impurity concentration higher than the first impurity concentration, and the undoped region includes a separating zone separating two of the first wells. At least two circuit blocks are provided each having a circuit area within one of the pairs of the first well and the second well. One of the first wells includes between the boundary thereof and the circuit area of corresponding circuit block a doped region of the first conductive type having an impurity concentration higher than the impurity concentration of the first wells. The doped region is maintained at a certain potential.

In the semiconductor device according to the present invention, since the separating zone of the first conductive type has a high resistance as compared to those of the well of the first conductive type and the diffused layer of the first conductive type, there is a little noise propagation between circuit blocks. Even when the noise propagates through the high resistance of the separating zone of the first conductive type, the noise is absorbed through the diffused layer of the first conductive type by a source line maintaining the diffused layer at the certain potential. Since the electric potential of the well of the first conductive type including the diffused layer can be maintained at the predetermined level during the absorption of the noise, adverse effects of noise produced at these portions can be reduced.

Accordingly, in the semiconductor device according to the present invention, noise propagating between two circuit blocks can be reduced, thereby increasing accuracy of signals, and also increasing the reliability of the semiconductor device.

BRIEF DESCRIPTION OF THE DRAWINGS

The above and other objects as well as features and advantages of the present invention will be more apparent from the following description, referring to the accompanying drawings in which.

DETAILED DESCRIPTION OF THE PREFERRED EMBODIMENTS

Figure 3A:
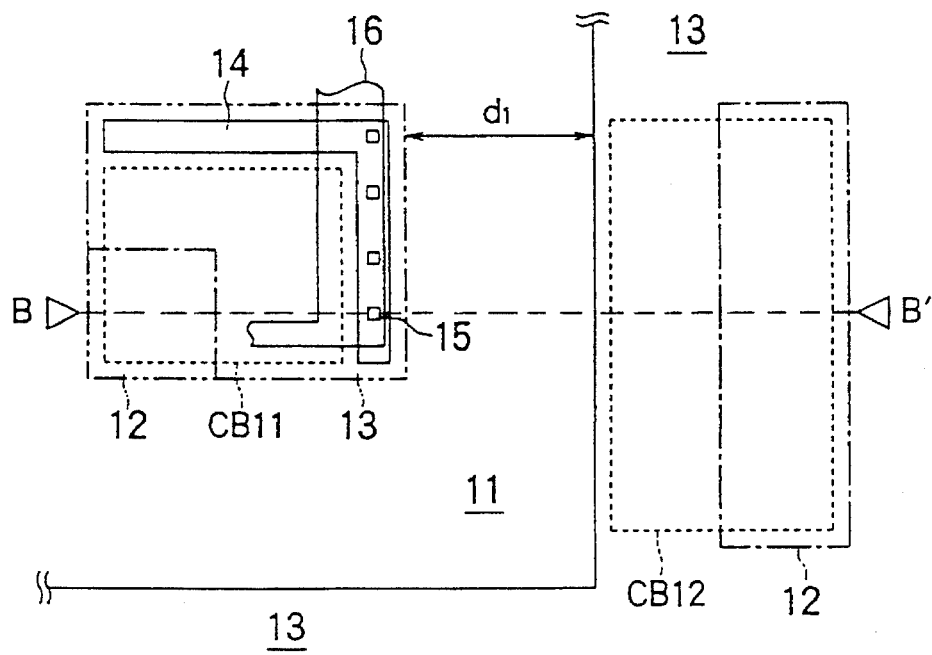
FIG. 3A is a schematic plan view of a semiconductor device according to a first embodiment of the present invention.
Figure 3B:
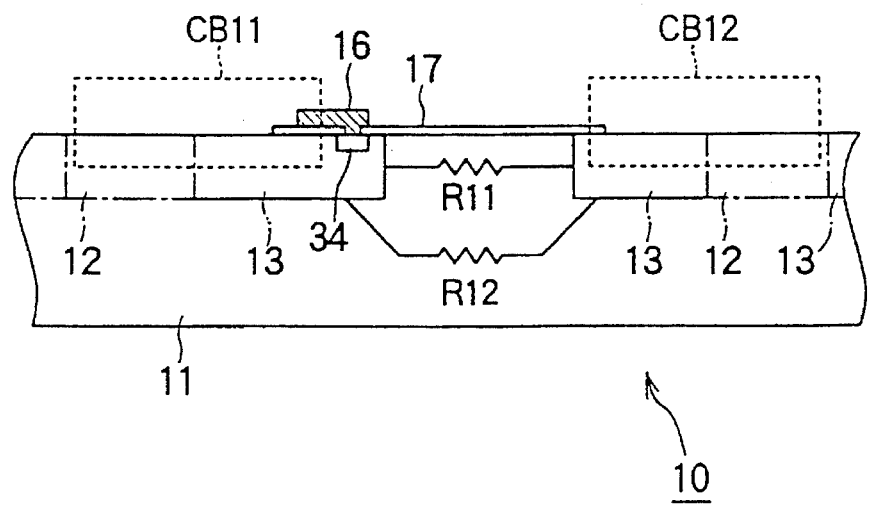
FIG. 3B is a sectional view taken along line B–B' of FIG. 3A.

The present invention will now be described in more detail with reference to the accompanying drawings. FIG. 3A is a schematic plan view of a semiconductor device according to a first embodiment of the present invention, and FIG. 3B is a sectional view taken along dashed line B–B' of FIG. 3A. In the vicinity of the main surface of a P-substrate 10 of the semiconductor device, N-wells 12 and P-wells 13 are formed on an undoped P-region 11 of the P-substrate 10 by ion implantation or other method. On the N-wells 12 and the P-wells 13, there are formed circuit blocks CB11 and CB12 each having a circuit region spreading over one of the N-wells 12 and one of the P-wells 13 adjacent the one of the N-wells 12. For example, circuit block CB11 includes an analog circuit while circuit block CB12 includes a digital circuit which constitutes a noise source.

At the periphery of circuit block CB11, a P-type separating zone is left in the vicinity of the main surface of the P-substrate 10 as a portion of an undoped P-region 11 of the P-substrate 10. The separating zone of the P-region 11 has a predetermined width d1, such as 15 µm, and neither an N-well nor a P-well is formed in this region. The width d1 of the P-type separating zone 11 can be made as narrow as desired, so long as it can effectively separate two adjacent P-wells 13. However, the width of the P-type separating zone 11 should be designed to be not less than about 4 µm, taking account of spreading of an impurity during diffusion process. The width d1 may be varied in the longitudinal direction of the separating zone.

One of the P-wells 13 on which circuit block CB11 is formed is provided therein with a P+ diffused layer 14. The P+ diffused layer 14 is formed at a location adjacent to the P-type separating zone so that the P+ diffused layer 14 is disposed between the P-type separating zone and circuit block CB11. It is preferable that the P+ diffused layer surrounds the entire portion of circuit block CB11 disposed in the P-well 13, although the P+ diffused layer 14 does not surround the entire portion of the CB11 disposed in the P-well in the drawings.

The P+ diffused layer 14 is electrically connected to a ground line 16 (or Vss source line) through contact holes 15 formed in an insulator layer 17. Although an N+ diffused layer can be formed in the N-wells 12 in addition to the P+ diffused layer 14 formed in the P-well 13, the effect obtained by such an N+ diffused layer is small as compared to the effect obtained by the P+ diffused layer 14 formed in the P-well 13, because the noise propagating from the P-type separating zone 11 to the N-well 12 is not large.

In the semiconductor device according to the first embodiment, only the undoped region 11 of the semiconductor substrate 10 (including an impurity at NA=1E15 cm−3, for example) exists between circuit block CB12 acting as a noise source and circuit block CB11. Therefore, as shown in FIG. 3A, circuit block CB12 and circuit block CB11 are coupled with each other through an equivalent resistance R11 representing the resistance of the P-type separating zone located in the vicinity of the main surface of the semiconductor substrate 10 and an equivalent resistance R12 representing the resistance of the main area of the undoped region 11 of the semiconductor substrate 10 located below P-well 13.

Since the resistivity $r_{PSUB}$ of the P-type semiconductor substrate 10 including the undoped separating zone 11 is about 12 Ω–cm and the resistivity $r_{PWEL}$ of the P-well 13 (including an impurity of NA=1E17 cm−3, for example) is about 0.3 Ω–cm, the resistivity $r_{PSUB}$ of the undoped region 11 is 40 times higher than the resistivity $r_{PWEL}$ of the P-well 13. Accordingly, the equivalent resistances R11 and R12 have considerably high values in proportion to the resistivity $r_{PSUB}$ of the P-substrate 10.

Although the ground line 16 and the P+ diffused layer 14 have some impedances, these impedances are very small as compared to the equivalent resistances R11 and R12. Therefore, the ground line 16 and the P+ diffused layer 14 can easily stabilize the electric potential in the P-well 13, thereby drastically reducing the adverse effect of the noise propagating from circuit block CB12 acting as a noise source to circuit block CB11.

Figure 1A:
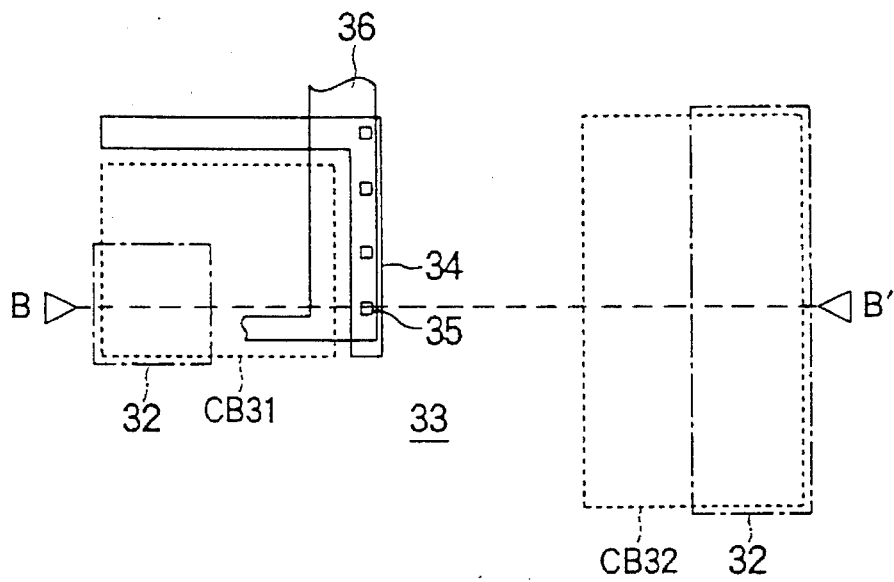
FIG. 1A is a schematic plan view of a conventional semiconductor device.
Figure 1B:
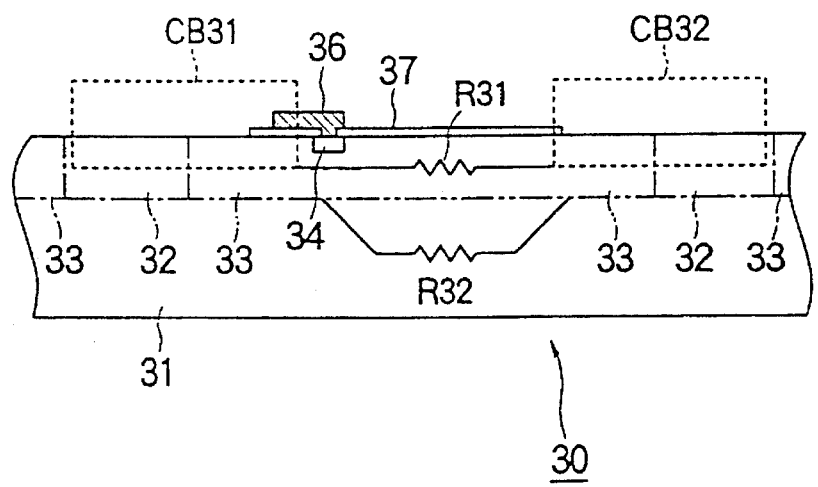
FIG. 1B is a sectional view taken along line B–B' of FIG. 1A.
Figure 4A:
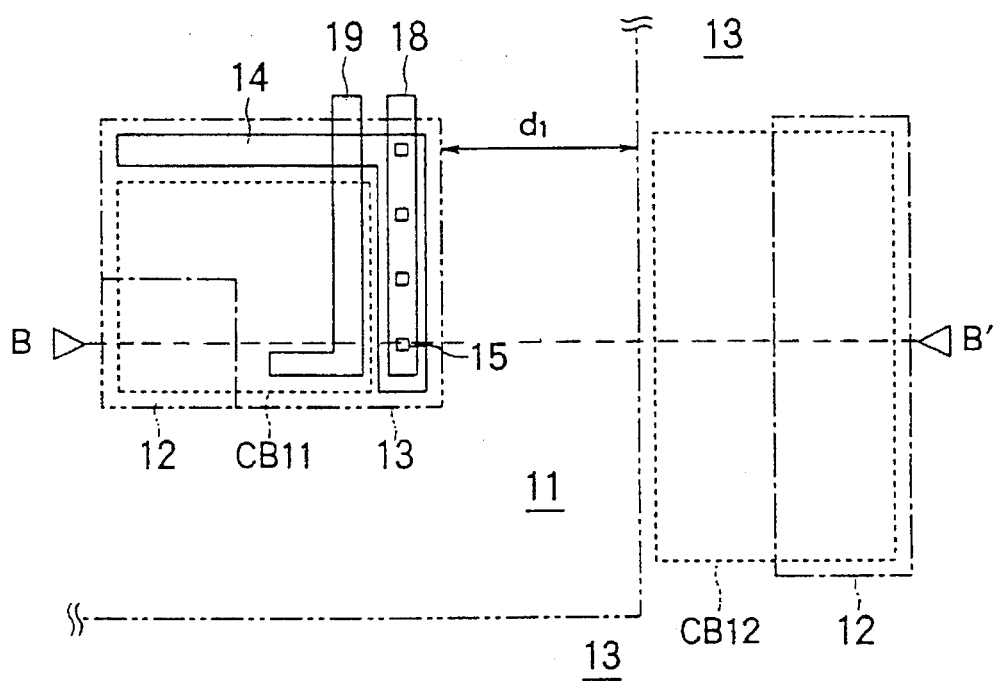
FIG. 4A is a schematic plan view of a semiconductor device according to a second embodiment of the present invention.
Figure 4B:
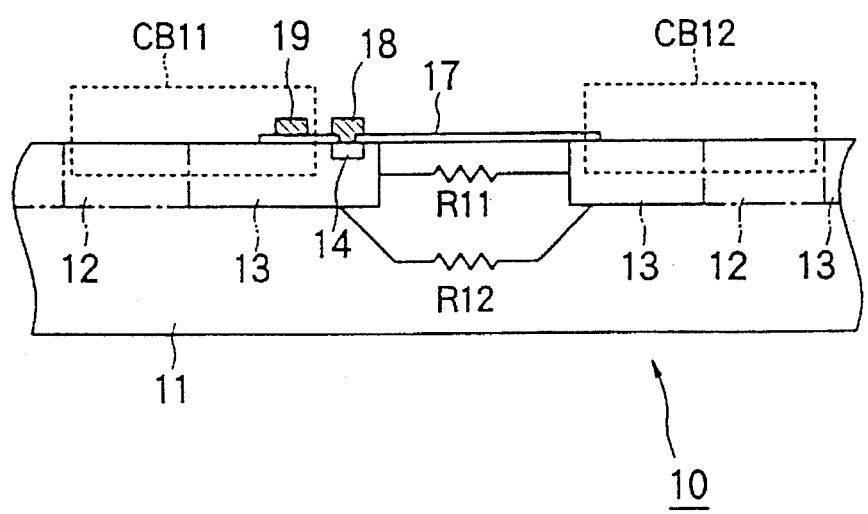
FIG. 4B is a sectional view taken along line B–B' of FIG. 4A.

FIG. 4A is a schematic plan view of a semiconductor device according to a second embodiment of the present invention, and FIG. 4B is a sectional view taken along dashed line B–B' of FIG. 4A. In this embodiment, as is the case in the first embodiment, a separating zone of an undoped region 11 of a P-substrate 10 is formed between two P-wells 13. A P+ diffused layer 14 is formed in the P-well 13 between the boundary of the P-well 13 and circuit block CB11 to shield the circuit block CB11 having a circuit area on the P-well 13. The P+ diffused layer 14 is electrically connected to a ground line 18 through contact holes 15 formed in an insulator layer 17. This ground line 18 and another ground line 19 for providing electric source to circuit block CB11 are separately connected to different power supply terminals. Since the remaining portions are similar to those of the first embodiment shown in FIGS. 1A and 1B, further description thereof will be omitted here.

With the second embodiment, as with the first embodiment, noise from a circuit block CB12 acting as a noise source propagates through the equivalent resistances R11 and R12 of the P-substrate 11 to the P-well 13 in which circuit block CB11 has a circuit area. The noise, however, flows to the ground line 18 through the P+ diffused layer 14, and is thereby absorbed. Since the P+ diffused layer 14 and the ground line 18 have some impedances, the electric potential in the ground line 18 may fluctuate even though the amount of the fluctuation is very small. In the second embodiment, the ground line 18 is separated from the ground line 19 which connects circuit block CB11 to the corresponding power source, so that it becomes possible to further reduce noise affecting circuit block CB11.

Figure 5A:
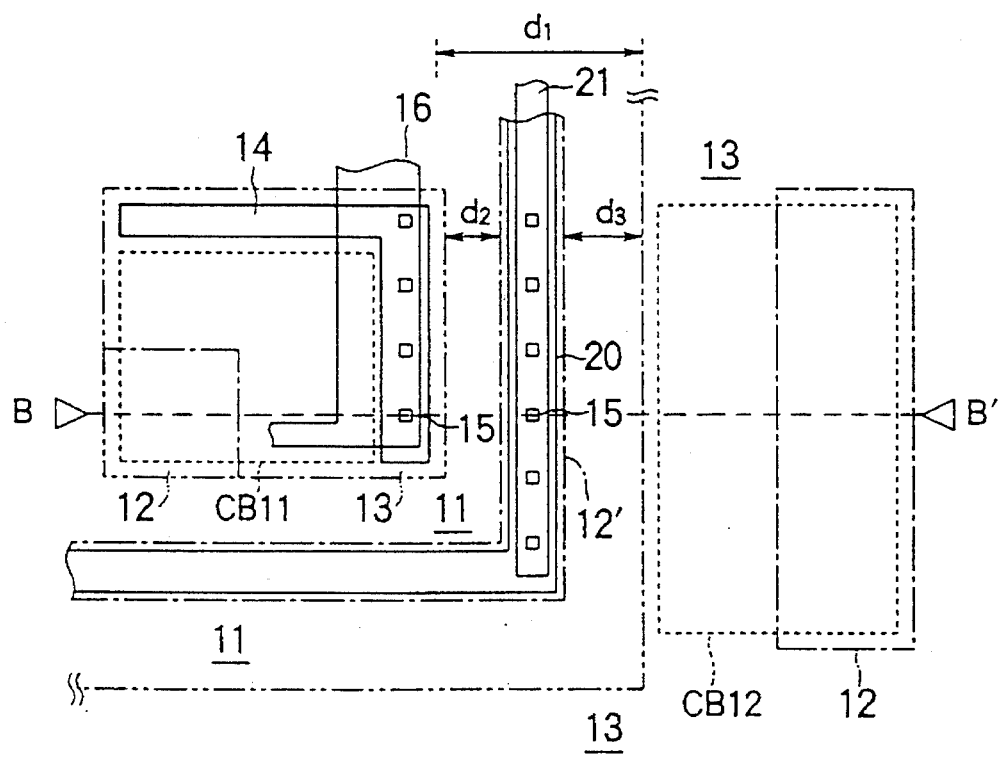
FIG. 5A is a schematic plan view of a semiconductor device according to a third embodiment of the present invention.
Figure 5B:
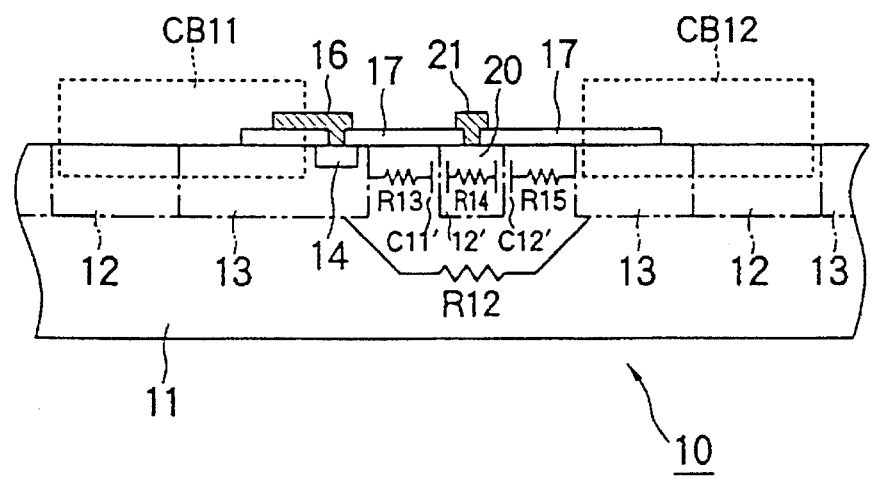
FIG. 5B is a sectional view taken along line B–B' of FIG. 5A.

FIG. 5A is a schematic plan view of a semiconductor device according to a third embodiment of the present invention, and FIG. 5B is a sectional view taken along dashed line B–B' of FIG. 5A. In this embodiment, a P-type separating zone having a width d1 is left around the periphery of circuit block CB11 as a portion of an undoped region 11 of a P-substrate 10, and an N-well 12' (called as cross-talk reducing N-well 12' hereinafter) is additionally formed in the P-type separating zone 11 for further reducing cross-talk. The depth of the N-well 12' is nearly equal to the depth of the P-well 13 and N-well 12.

The distances d2 and d3 between both the boundaries of the cross-talk reducing N-well 12' and the corresponding boundaries of the N-well 12 or the P-wells 13 located opposite to both sides of the N-well 12' are greater than the distance between each N-well 12 and a corresponding P-well 13 adjacent thereto over which circuit block CB11 or CB12 are located. For example, the distances d2 and d3 are designed to be greater than about 5 μm. The distances d2 and d3 are sufficient if both the P-well 13 (or N-well 12) and the N-well 12' are effectively separated from each other by the P-type separating zone of the undoped region 11.

An N+ diffused layer 20 is formed in the cross-talk reducing N-well 12', and the N+ diffused layer 20 is connected to the Vdd source line 21 through contact holes 15 formed in an insulator layer 17. Accordingly, the electric potential of the cross-talk reducing N-well 12' is maintained equal to the potential of the Vdd source line.

In the third embodiment as described above, since the cross-talk reducing N-well 12' connected to the Vdd line 21 is formed between circuit block CB12 and circuit block CB11, the DC components of noise propagating in the vicinity of the main surface of the P-substrate 10 including P-wells 13 can be reduced by the shielding effect of the N-well 12' A P+ diffused layer 14 is formed in the P-well 13 on which a circuit portion of circuit block CB11 is formed, and the P+ diffused layer 14 is electrically connected to a ground line 16 through contact holes 15 formed in the insulator layer 17, so that noise propagating through an equivalent resistance R12 of the portion of the undoped P-region 11 located below tile N-well 12' can be absorbed through the ground line 16 and thereby reduced.

Figure 2A:
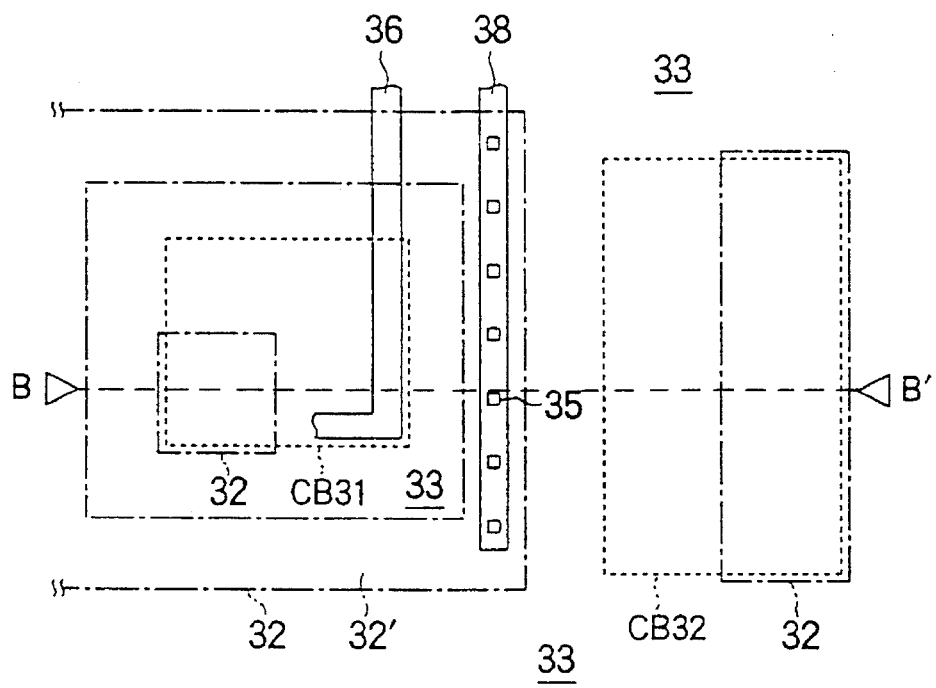
FIG. 2A is a schematic plan view of another conventional semiconductor device.
Figure 2B:
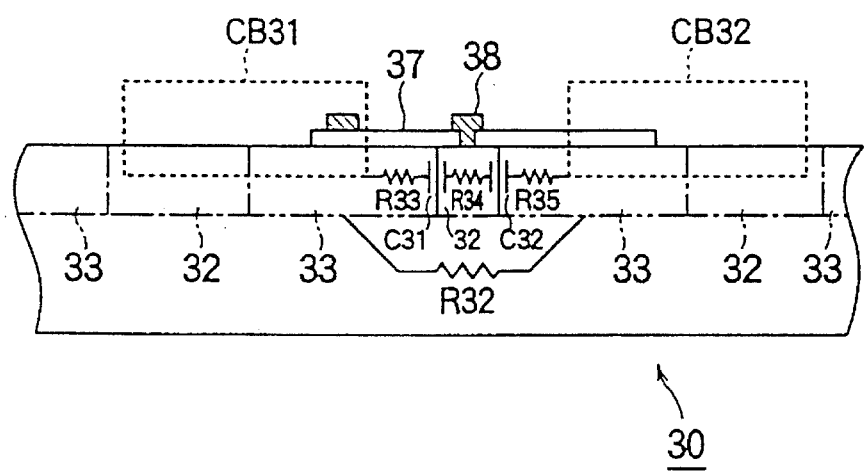
FIG. 2B is a sectional view taken along line B–B' of FIG. 2A.

In the semiconductor device according to the third embodiment, as shown in FIG. 5B, circuit block CB12 and circuit block CB11 are electrically coupled with each other in the vicinity of the main surface of the P-substrate 10 through a serial circuit of the equivalent resistances R13 and R15 of the P-type undoped region 11 of the P-substrate 10, the equivalent resistance R14 of the N-well 12' and the junction capacitances C11' and C12' formed between the P-substrate 11 and the N-well 12'. The equivalent resistances R13 and R15 of the surface region of the P-substrate 10 are 40 times higher than the equivalent resistances R33 and R35 of the P-wells 33 shown in FIG. 2B.

In addition, the junction capacitance per unit area between the separating zone 11 and the cross-talk reducing N-well 12' (including an impurity at ND=1E17 cm–3, for example) is 3.7E-19 F/cm2, as is given by formulas (1-a) and (1-b), when the bias voltage VR is –5 V. This junction capacitance per unit area is considerably small as compared to the junction capacitance per unit area, i.e., 2.6E–08 F/cm2 between the P-well 33 and the N-well 32 in the semiconductor device shown in FIGS. 2A and 2B. Specifically, the junction capacitances C11 and C12 are not greater that about one-seventh of the junction capacitances C31 and C32 shown in FIG. 2B.

Accordingly, the serial circuit of R13, R14, R15, C11 and C12 maintains a sufficiently high impedance even in the high-frequency range, making it possible to reduce high-frequency noise propagating from circuit block CB12 to circuit block CB11. Moreover, since the N+ diffused layer 20 is formed in the cross-talk reducing N-well 12' in this third embodiment, the resistance between the cross-talk reducing N-well 12' and the Vdd line 21 can be reduced, thereby increasing the effect of noise reduction further more.

A common source line may be used as the Vdd line 21 connected to the N+ diffused layer 20 formed in the cross-talk reducing N-well 12' and as the Vdd line for supplying power for circuit block CB11. However, in the case where the Vdd line 21 connected to the N+ diffused layer 20 is separated from the Vdd line for circuit block CB11, noise propagating through the Vdd lines can be further reduced. The separation of the source lines may be effected only within the semiconductor device or may be effected within and outside the semiconductor device.

In the embodiments as described above, the P-conductive type is adopted as the first conductive type of semiconductor while the N-conductive type is adopted as the second conductive type. However, the N-conductive type may be adopted as the first conductive type while the P-conductive type may be adopted as the second conductive type in the present invention.

Further, in the above embodiments, semiconductor devices for analog/digital hybrid circuits are described as examples for the semiconductor device of the present invention. The present invention, however, can be applied to an analog/analog circuit as well as digital/digital circuit. In the present invention, the term "circuit block" includes, for example, a circuit block comprising an amplifier, operational amplifier, filter, analog-to-digital converter, digital-to-analog converter, random access memory, counter, register or combination thereof.

Since above embodiments are described only for examples, the present invention is not limited to such embodiments and it will be obvious for those skilled in the art that various modifications and alterations can be easily made based on the above embodiment within the scope of the present invention.

What is claimed is:

1. A semiconductor device comprising:

a semiconductor substrate of a first conductive type defining an inherent region of said semiconductor substrate having a first impurity concentration and at least two pairs of wells, each pair of wells including a first well of the first conductive type and a second well of a second conductive type disposed adjacent to each other in the vicinity of a main surface of said semiconductor substrate, each of said first and second of said pairs of wells having an impurity concentration higher than the first impurity concentration, said inherent region including a separating zone separating two of said first well; and at least two circuit blocks each having a circuit area within corresponding one of said pairs of said first well and said second well, one of said first wells including between the boundary of said first well and the circuit area of a corresponding one of said circuit blocks a first doped region of the first conductive type having an impurity concentration higher than the impurity concentration of said one of said first wells, said first doped region being maintained at a first potential.

2. A semiconductor device according to claim 1 further comprising a first source line and a second source line both maintained at said first potential, said first source line supplying power for corresponding one of said circuit blocks, said second source line maintaining said first doped region at said first potential.

3. A semiconductor device according to claim 1 further comprising: a third well of the second conductive type disposed in said separating zone and having an impurity concentration higher than said first impurity concentration; and a second doped region of the second conductive type having an impurity concentration higher than said impurity concentration of said third well, said third well having no functional circuit block formed within said third well, said second doped region being maintained at a second potential.

4. A semiconductor device according to claim 1 wherein the width of said separating zone is not less than about 4 μm.

5. A semiconductor device according to claim 1 wherein said circuit blocks include a digital circuit block and an analog circuit block.

6. A semiconductor device according to claim 1 wherein both of said circuit blocks are analog circuit blocks.

7. A semiconductor device according to claim 1 wherein said first conductive type is a P-conductive type and said second conductive type is an N-conductive type.

* * * * *